(12) United States Patent
Saisho

(10) Patent No.: US 11,021,783 B2
(45) Date of Patent: Jun. 1, 2021

(54) REACTIVE SPUTTERING APPARATUS AND FILM FORMATION METHOD FOR COMPOSITE METAL COMPOUND FILM OR MIXTURE FILM USING THE SAME

(71) Applicant: Shincron Co., Ltd., Kanagawa (JP)

(72) Inventor: Shinichiro Saisho, Kanagawa (JP)

(73) Assignee: SHINCRON CO., LTD., Yokohama (JP)

( * ) Notice: Subject to any disclaimer, the term of this patent is extended or adjusted under 35 U.S.C. 154(b) by 56 days.

(21) Appl. No.: 16/305,785

(22) PCT Filed: Apr. 20, 2018

(86) PCT No.: PCT/JP2018/016278
§ 371 (c)(1),
(2) Date: Nov. 29, 2018

(87) PCT Pub. No.: WO2019/202729
PCT Pub. Date: Oct. 24, 2019

(65) Prior Publication Data
US 2020/0040440 A1    Feb. 6, 2020

(51) Int. Cl.
*C23C 14/00* (2006.01)
*C23C 14/54* (2006.01)

(52) U.S. Cl.
CPC ...... *C23C 14/0063* (2013.01); *C23C 14/0089* (2013.01); *C23C 14/542* (2013.01)

(58) Field of Classification Search
CPC ............ C23C 14/3485; C23C 14/3464; C23C 14/0036; C23C 14/0073; C23C 14/0084;
(Continued)

(56) References Cited

U.S. PATENT DOCUMENTS 6,207,536 B1    3/2001  Matsumoto et al.
8,546,176 B2 *  10/2013 Lee ................... C23C 14/0623
                                                        438/95
(Continued)

FOREIGN PATENT DOCUMENTS

EP    0230652        8/1987
JP    2004-291464 A  10/2004
(Continued)

OTHER PUBLICATIONS

Supplemental Search Report which corresponds to EP Application No. 18795279; dated Mar. 17, 2020.

*Primary Examiner* — Michael P Wieczorek
(74) *Attorney, Agent, or Firm* — Muncy, Geissler, Olds & Lowe, P.C.

(57) ABSTRACT

An apparatus is provided, comprising: a film formation chamber; a substrate holder provided in the film formation chamber and holding a substrate (S) to be formed with a film; a decompressor configured to reduce a pressure in the film formation chamber to a predetermined pressure; a discharge gas introducer configured to introduce a discharge gas into the film formation chamber; two or more sputtering electrodes each provided with a target (T1, T2) to be a film-forming material, the sputtering electrodes facing the substrate as a single substrate; a DC power source configured to supply electric power to the sputtering electrodes; two or more pulse-wave conversion switches connected between the DC power source and the sputtering electrodes, the pulse-wave conversion switches each being configured to convert a DC voltage to be applied to each of the sputtering electrodes to a pulse-wave voltage; a programmable transmitter configured to be programmable with a pulse generation control signal pattern corresponding to the electric power to be supplied to each of the sputtering electrodes, the programmable transmitter being further con- (Continued)

figured to control each of the pulse-wave conversion switches in accordance with the program; and a pulsed reactive gas introducer configured to control introduction of the reactive gas from the reactive gas introducer to the film foiniation chamber on the basis of the pulse generation control signal pattern from the electric power controller.

15 Claims, 18 Drawing Sheets

(58) Field of Classification Search
CPC .............. C23C 14/0063; C23C 14/0089; C23C 14/542
See application file for complete search history.

(56) References Cited

U.S. PATENT DOCUMENTS

| | | | |
|---|---|---|---|
| 9,150,960 B2* | 10/2015 | Nauman | C23C 14/3485 |
| 9,551,060 B2* | 1/2017 | Gomi | H01J 37/3244 |
| 2001/0015173 A1 | 8/2001 | Matsumoto et al. | |
| 2006/0027451 A1* | 2/2006 | Park | C23C 14/34 |
| | | | 204/192.26 |
| 2011/0223346 A1 | 9/2011 | Kitada et al. | |
| 2014/0102879 A1 | 4/2014 | Nishioka et al. | |
| 2015/0354052 A1 | 12/2015 | Bugyi et al. | |
| 2016/0005577 A1 | 1/2016 | Tsukamoto | |
| 2016/0369390 A1 | 12/2016 | Bartzsch et al. | |

FOREIGN PATENT DOCUMENTS

| | | |
|---|---|---|
| JP | 2005-210008 A | 8/2005 |
| JP | 3735461 B2 | 1/2006 |
| JP | 2007-138268 A | 6/2007 |
| JP | 2008-050654 A | 3/2008 |
| JP | 2014-224277 A | 12/2014 |
| JP | 2016-509134 A | 3/2016 |
| TW | 201508077 A | 3/2015 |

* cited by examiner

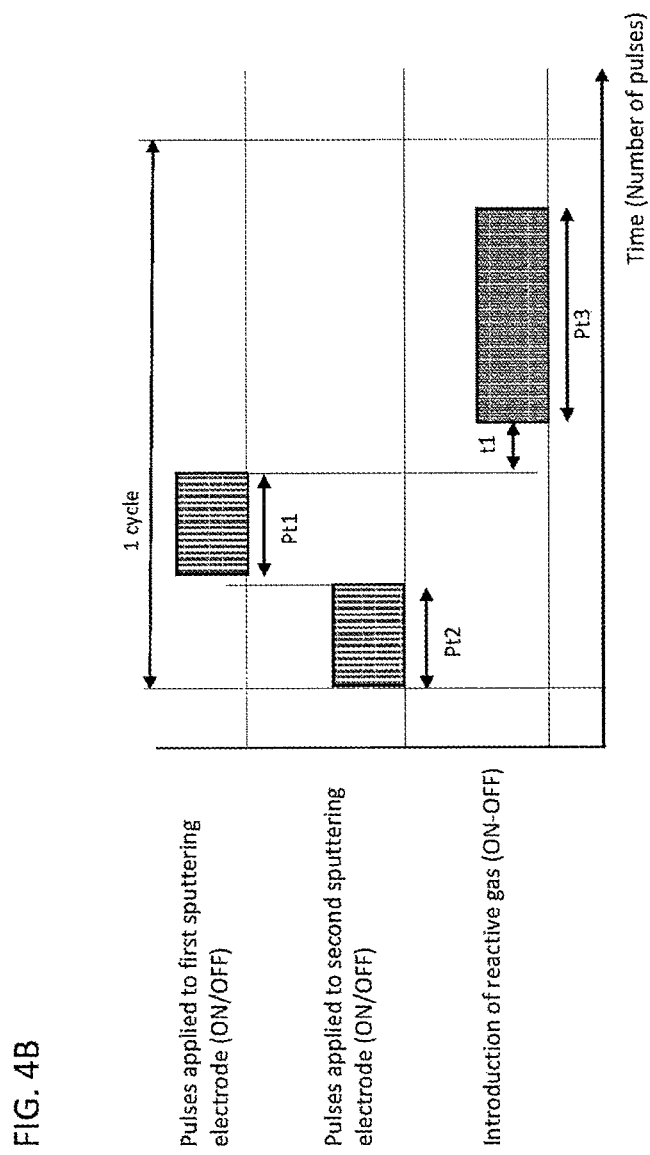

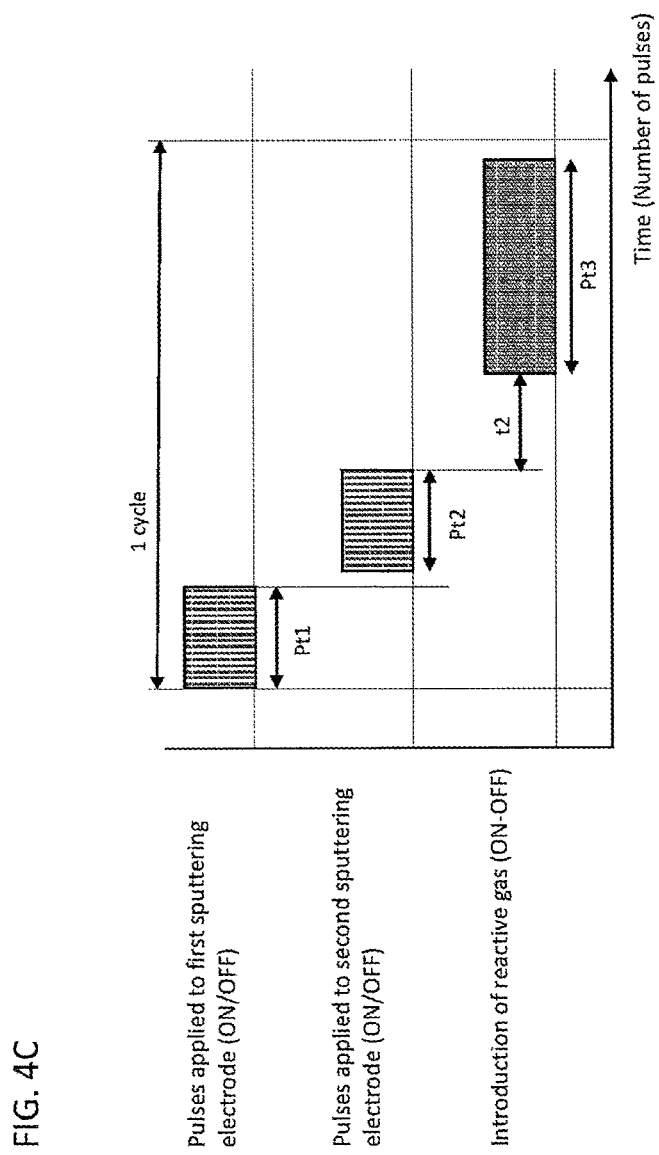

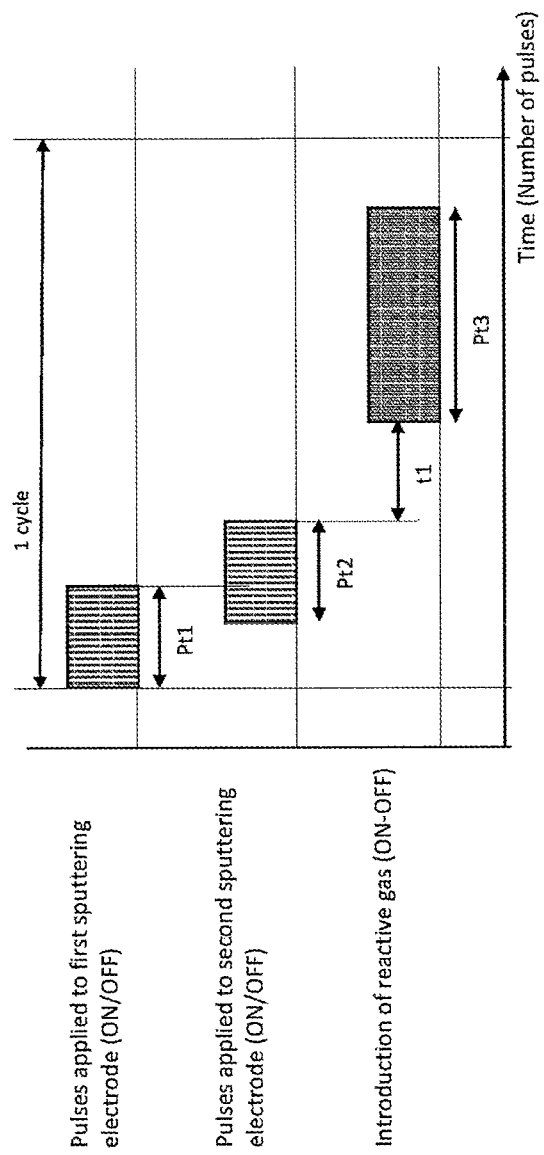

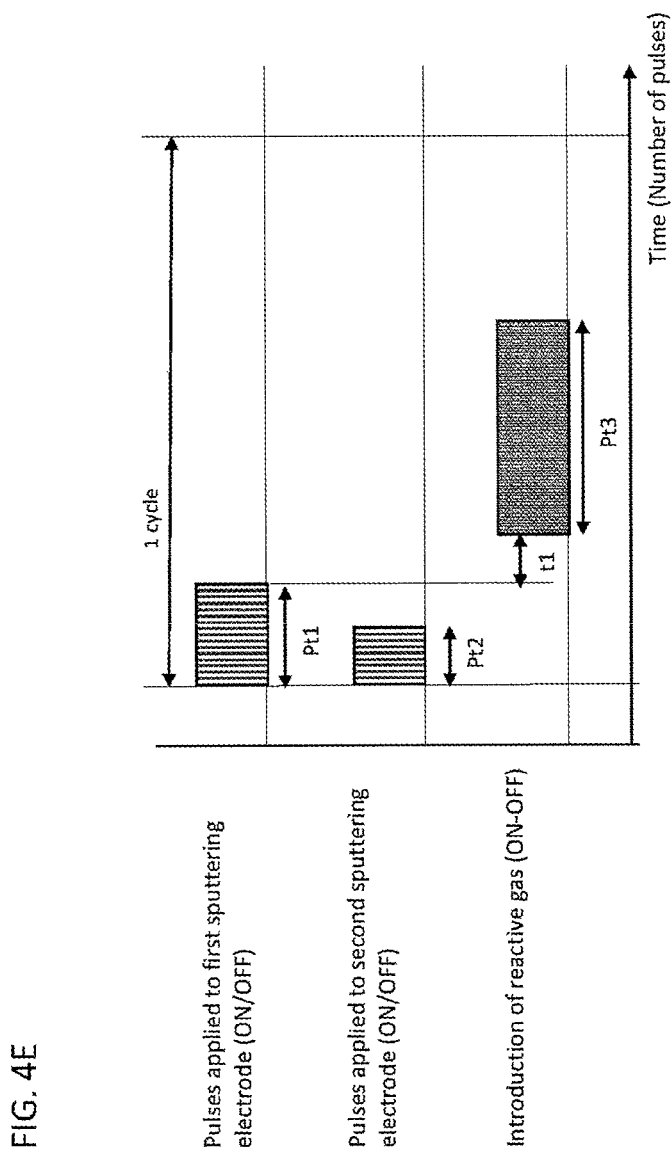

REACTIVE SPUTTERING APPARATUS AND FILM FORMATION METHOD FOR COMPOSITE METAL COMPOUND FILM OR MIXTURE FILM USING THE SAME

TECHNICAL FIELD

The present invention relates to a reactive sputtering apparatus and a film formation method for a composite metal compound film or a mixture film using the reactive sputtering apparatus.

BACKGROUND ART

As a reactive sputtering apparatus of this type, an apparatus for forming a thin film of a composite metal compound is known which comprises: film deposition process chambers in which independent targets formed of at least two different metals are sputtered so as to form on a substrate an ultrathin film of a composite metal or an incompletely-reacted composite metal; plasma generation means for generating plasma; a multi-aperture grid or a multi-slit grid disposed between the plasma generation means and a reaction process chamber for converting the ultrathin film to a composite metal compound; the reaction process chamber for irradiating the ultrathin film formed in the film deposition process chambers with an activated species of a reactive gas, which is selectively introduced through the grid, so as to convert the composite metal or the incompletely-reacted composite metal to a composite metal compound through the reaction of the ultrathin film with the activated species of the reactive gas; and separation means for separating the reaction process chamber from the film deposition process chambers in terms of space and pressure by means of shield plates (Patent Document 1). According to this radical assisted sputter (RAS)-type reactive sputtering apparatus, a thin film of a composite metal compound having a desired film thickness is formed on the substrate and the thin film can have any refractive index within the range between the optical refractive index intrinsic to a constituent metal compound of the thin film and the optical refractive index intrinsic to another constituent metal compound of the thin film.

PRIOR ART DOCUMENT

Patent Document

[Patent Document 1] JP3735461B

SUMMARY OF INVENTION

Problems to be Solved by Invention

However, the above conventional apparatus for forming a composite metal compound film using the targets formed of at least two different metals has a configuration in which a plurality of substrates is held by a cylindrical substrate holder and in this state the substrate holder is rotated; therefore, the passage time through the sputtering region and the passage time through the plasma region may be uniquely determined depending on the structure of the apparatus for film formation and they may not be controlled independently. Thus, in order to arbitrarily set the composition of the composite metal compound film, it may be necessary to independently control the power and the like supplied to two or more sputtering electrodes, so that the sputtering power source may be required for each sputtering electrode.

In addition, the above conventional apparatus for film formation has a configuration in which the cylindrical substrate holder is rotated in one direction while holding the substrate and, therefore, the order of deposition of the ultrathin films may be uniquely determined depending on the structure of the apparatus for film formation and may not be easily changed. Moreover, it is advantageous to increase the rotational speed of the rotating body to maintain the thickness of the ultrathin film, but in this case, a high-rating driving motor may be required. Furthermore, the apparatus is configured such that the substrate is held by the cylindrical substrate holder and, therefore, the interior of the cylindrical substrate holder may be an unnecessary space, so that not only the film deposition process chambers become large, but also a high-rating vacuum pump may be required.

Problems to be solved by the present invention include providing a reactive sputtering apparatus with which the composition of a composite metal compound film or a mixture film can be freely set and providing a film formation method for a composite metal compound film or a mixture film using the reactive sputtering apparatus.

Means for Solving Problems

The present invention solves the above problems as follows. Two or more pulse-wave conversion switches are provided between a DC power source and two or more sputtering electrodes so as to correspond to the two or more sputtering electrodes. The pulse-wave conversion switches each convert a DC voltage to a pulse-wave voltage. The pulse-wave conversion switches may be operated by a signal generator configured to generate block pulses in accordance with a program that is arbitrarily created. The pulse-wave conversion switches, a reactive gas introduction switch, and a required time for a reaction are controlled thereby to appropriately set the electric power to be supplied to each sputtering electrode and the timing of reactive gas introduction.

Effect of Invention

According to the present invention, a reactive sputtering apparatus can be provided with which the composition of a composite metal compound film or a mixture film can be freely set by means of the DC power source, and a film formation method for a composite metal compound film or a mixture film using the reactive sputtering apparatus can also be provided.

BRIEF DESCRIPTION OF DRAWINGS

FIG. 4B is a time chart illustrating a second example of a film formation method using the reactive sputtering apparatus according to the present invention.

FIG. 4C is a time chart illustrating a third example of a film formation method using the reactive sputtering apparatus according to the present invention.

FIG. 4D is a time chart illustrating a fourth example of a film formation method using the reactive sputtering apparatus according to the present invention.

FIG. 4E is a time chart illustrating a fifth example of a film formation method using the reactive sputtering apparatus according to the present invention.

MODE(S) FOR CARRYING OUT THE INVENTION

«Reactive Sputtering Apparatus»

Figure 1:
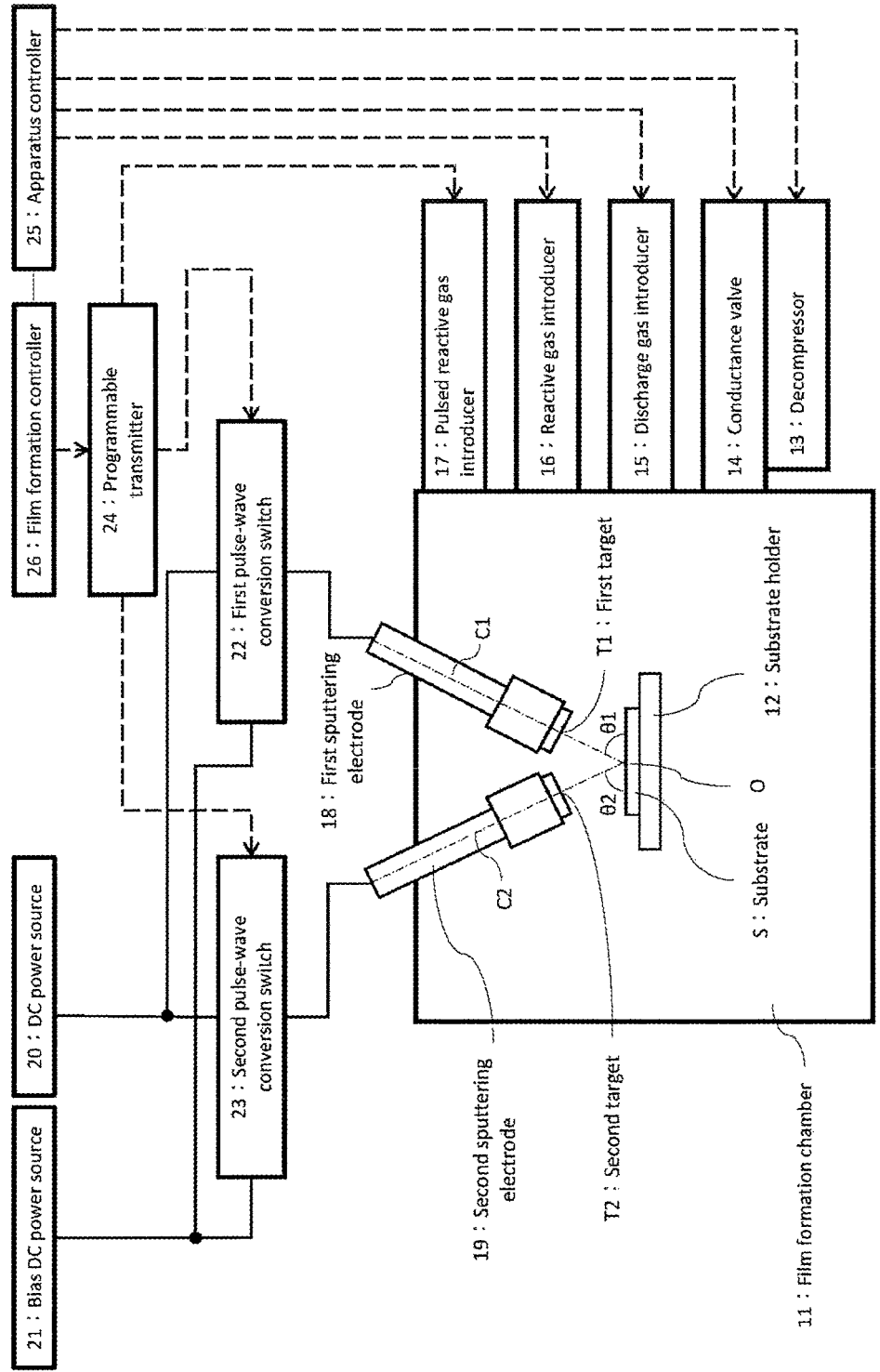
FIG. 1 is a block diagram illustrating an embodiment of the reactive sputtering apparatus according to the present invention.

Hereinafter, one or more embodiments of the present invention will be described with reference to the drawings. FIG. 1 is a block diagram illustrating an embodiment of the reactive sputtering apparatus of the present invention. The reactive sputtering apparatus 1 according to the present embodiment includes a film formation chamber 11 that forms a substantially closed space. The film formation chamber 11 is provided with a substrate holder 12 and two or more sputtering electrodes (a first sputtering electrode 18 and a second sputtering electrode 19 in this example). The substrate holder 12 holds a substrate S to be formed with a film. The sputtering electrodes are provided with respective targets to be film-forming materials (a first target T1 and a second target T2 in this example). The sputtering electrodes are arranged to face the substrate S as a single substrate. The film formation chamber 11 is also provided with a decompressor 13 that reduces the pressure in the film formation chamber 11 to a predetermined pressure, a conductance valve 14 that controls the pressure in the film formation chamber 11 to be reduced by the decompressor 13, a discharge gas introducer 15 that introduces a discharge gas into the film formation chamber 11, a reactive gas introducer 16 that introduces a reactive gas into the film formation chamber 11, and a pulsed reactive gas introducer 17 that controls the reactive gas amount by the reactive gas introducer 16.

The reactive sputtering apparatus 1 of the present embodiment includes a DC power source 20 as a single DC power source that supplies electric power to the first sputtering electrode 18 and the second sputtering electrode 19. The reactive sputtering apparatus 1 of the present embodiment further includes two or more pulse-wave conversion switches (a first pulse-wave conversion switch 22 and a second pulse-wave conversion switch 23 in this example) connected in parallel between the DC power source 20 and the first and second sputtering electrodes 18 and 19. The pulse-wave conversion switches convert a DC voltage to be applied to the first sputtering electrode 18 and the second sputtering electrode 19 to respective pulse-wave voltages. The reactive sputtering apparatus 1 of the present embodiment further includes a programmable transmitter 24, an apparatus controller 25, and a film formation controller 26. The programmable transmitter 24 is programmable with a pulse generation control signal pattern corresponding to the electric power to be supplied to each of the first sputtering electrode 18 and the second sputtering electrode 19. The programmable transmitter 24 controls each of the first pulse-wave conversion switch 22 and the second pulse-wave conversion switch 23 and the pulsed reactive gas introducer 17 in accordance with the program. The apparatus controller 25 controls the decompressor 13, the conductance valve 14, the discharge gas introducer 15, and the reactive gas introducer 16. The film formation controller 26 organizes the control of the entire reactive sputtering apparatus 1. These components will be described below.

The substrate holder 12 is formed in a flat plate-like shape and provided in the film formation chamber 11. The substrate S to be formed with a film is placed on the upper surface of the substrate holder 12. In response to a case in which the substrate S has to be heated during the film formation, the substrate holder 12 may be provided with a heater that heats the substrate S. Although not illustrated in FIG. 1, a load lock chamber is provided in a coupled manner with a side wall of the film formation chamber 11 via a gate valve. The substrate S is put in from the load lock chamber through the gate valve opened, such as using a loading mechanism, and is placed on the upper surface of the substrate holder 12. The substrate S completed with formation of a film is taken out from the substrate holder 12 into the load lock chamber using the loading mechanism. The reactive sputtering apparatus 1 of the present embodiment is a so-called single substrate-type reactive sputtering apparatus that performs sputtering for film formation on the substrate S as a single substrate. However, the reactive sputtering apparatus 1 of the present invention is not limited to the single substrate-type apparatus and may also be an apparatus in which a number of substrates S are put into the film formation chamber 11 for processing. The substrate holder 12 of this example may be provided with a rotation mechanism and/or a vertical motion mechanism for enhancing the uniformity of film formation qualities (such as a film thickness and a composition ratio) on the substrate S and/or an elevation mechanism for improving the workability when transferring the substrate S between the load lock chamber and the film formation chamber 11.

The first sputtering electrode 18 is provided such that the first target T1 to be a film-forming material is held by the tip surface of the first sputtering electrode 18 and the surface of the first target T1 faces the substrate S placed on the substrate holder 12. Likewise, the second sputtering electrode 19 is provided such that the second target T2 to be another film-forming material is held by the tip surface of the second sputtering electrode 19 and the surface of the second target T2 faces the substrate S placed on the substrate holder 12. In the reactive sputtering apparatus 1 of the present embodiment, two sputtering electrodes 18 and 19 are provided for one surface of the substrate S, but the reactive sputtering apparatus of the present invention is not limited to this, and three or more sputtering electrodes may also be provided for one surface of the substrate S.

When a number of sputtering electrodes are arranged to face the substrate S, not all the target surfaces are parallel to the surface of the substrate S, but in consideration of ease of the film formation control, it is preferred to provide the sputtering electrodes so as to be in an equal or symmetrical arrangement with respect to the surface of the substrate S. The two sputtering electrodes illustrated in FIG. 1: the first sputtering electrode 18 and the second sputtering electrode 19 are arranged such that the center axis C1 of the first sputtering electrode 18 and the center axis C2 of the second sputtering electrode 19 are directed toward the center O of the substrate S and the angles θ1 and θ2 formed by the first sputtering electrode 18 and the second sputtering electrode 19 are equal.

The decompressor 13 includes an exhaust port, an exhaust pipe, and an evacuation pump (vacuum pump) for setting the pressure in the film formation chamber 11 to a pressure at which sputtering is possible. The sputtering process is carried out in a reduced pressure (vacuum) atmosphere of several Pa to several tens Pa, for example, and therefore the decompressor 13 evacuates the film formation chamber 11 so that it comes to a reduced pressure (vacuum) state to such an extent. After the film formation is completed, the decompressor 13 is stopped and the valve provided in the decompressor 13 can be opened thereby to return the film formation chamber 11 to ordinary pressure.

The discharge gas introducer 15 includes an introduction port, an introduction pipe, a flow control valve, and a pump for supplying the discharge gas (a gas that releases electrons which collide with the targets in the sputtering process) into the film formation chamber 11. The discharge gas may be, for example, but is not limited to, an inert gas such as argon gas.

The reactive gas introducer 16, which is used when carrying out the reactive sputtering process, includes an introduction port, an introduction pipe, a flow control valve, and a pump for introducing the reactive gas into the film formation chamber 11. The pulsed reactive gas introducer 17 performs ON/OFF control of the flow control valve of the reactive gas introducer 16 thereby to control the introduction timing and introduction amount of the reactive gas introduced into the film formation chamber 11. When sputtering metal oxide films or metal nitride films as the film-forming substances, oxygen gas or nitrogen gas may be introduced into the film formation chamber 11 from the reactive gas introducer 16. When the reactive sputtering is not carried out, the pulsed reactive gas introducer 17 may be controlled to stop introduction of the reactive gas from the reactive gas introducer 16.

The reactive sputtering apparatus 1 of the present embodiment is provided with only one DC power source 20. The DC power source 20 applies a DC voltage for discharge of −500 V to −several kV to the targets with respect to the grounded substrate S. This allows a part of the argon gas (discharge gas) to release electrons and be positively ionized, and the ionized argon gas then collides with the targets to sputter the target atoms, which are deposited on the substrate S.

Particularly in the present embodiment, the first pulse-wave conversion switch 22 is provided in the power supply line between the DC power source 20 and the first sputtering electrode 18 while the second pulse-wave conversion switch 23 is provided in the power supply line between the DC power source 20 and the second sputtering electrode 19. The same voltage as that of the DC power source 20 is applied to the first pulse-wave conversion switch 22 and the second pulse-wave conversion switch 23 because the switches 22 and 23 are connected in parallel to the DC power source 20. The first pulse-wave conversion switch 22 and the second pulse-wave conversion switch 23 are each composed of switching elements, etc. that convert the DC voltage from the DC power source 20 to a pulse-wave voltage. Examples of the switching elements capable of withstanding a high voltage of several kV include power transistors such as MOSFETs and IGBTs.

Figure 2A:
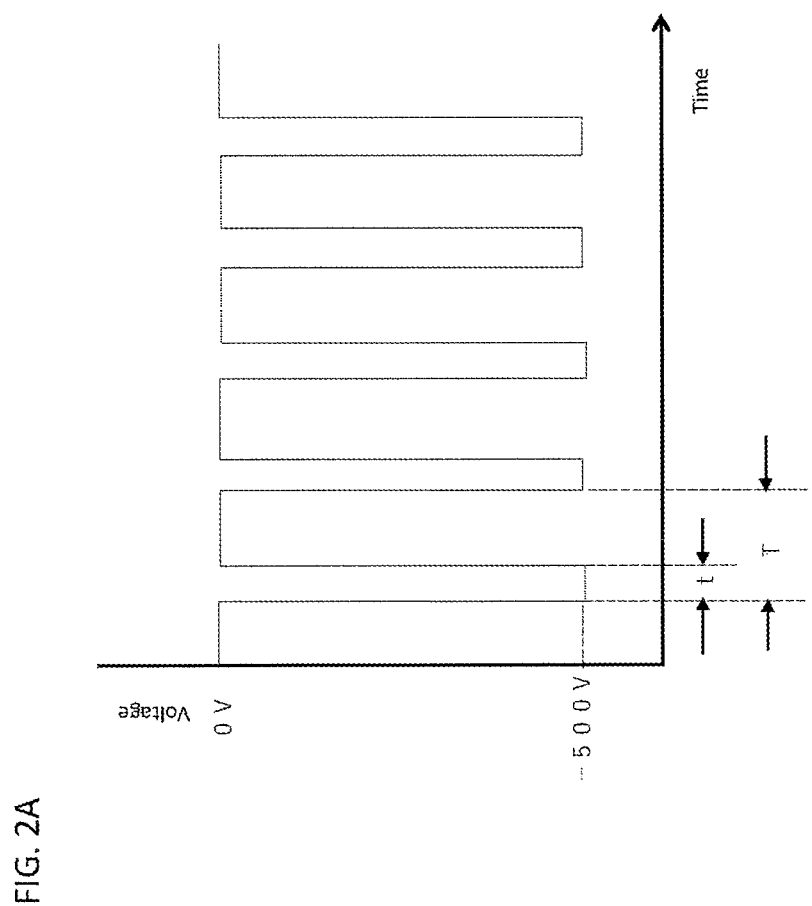
FIG. 2A is a voltage-time graph illustrating an example of the voltage pulse wave generated by a programmable transmitter 24, a first pulse-wave conversion switch 22, or a second pulse-wave conversion switch 23 of FIG. 1.

The first pulse-wave conversion switch 22 and the second pulse-wave conversion switch 23 are independently controlled by the programmable transmitter 24. That is, the programmable transmitter 24 outputs the pulse generation control signal pattern, which corresponds to the value of electric power to be supplied to each of the first sputtering electrode 18 and the second sputtering electrode 19, to each of the first pulse-wave conversion switch 22 and the second pulse-wave conversion switch 23 and performs the ON/OFF control. FIG. 2A is a voltage-time graph illustrating an example of the voltage pulse wave generated by the programmable transmitter 24, the first pulse-wave conversion switch 22, or the second pulse-wave conversion switch 23 of FIG. 1. For example, as illustrated in the voltage-time graph of FIG. 2A, the programmable transmitter 24 is configured to be arbitrarily programmable with a pattern of control signal including a frequency 1/T and a duty ratio t/T for ON/OFF of each of the first pulse-wave conversion switch 22 and the bias DC power source 23. Moreover, the programmable transmitter 24 is programmable for a single occurrence phenomenon because it is possible to create a waveform on the time axis without depending on a repetitive waveform. In addition, the programmable transmitter 24 has a function of adjusting the start timing of the internal cycle in the unit, so that the control signal pattern output to the first pulse-wave conversion switch 22 and the control signal pattern output to the second pulse-wave conversion switch 23 are generated with the same clock, and the synchronization is maintained with a high degree of accuracy.

Figure 2B:
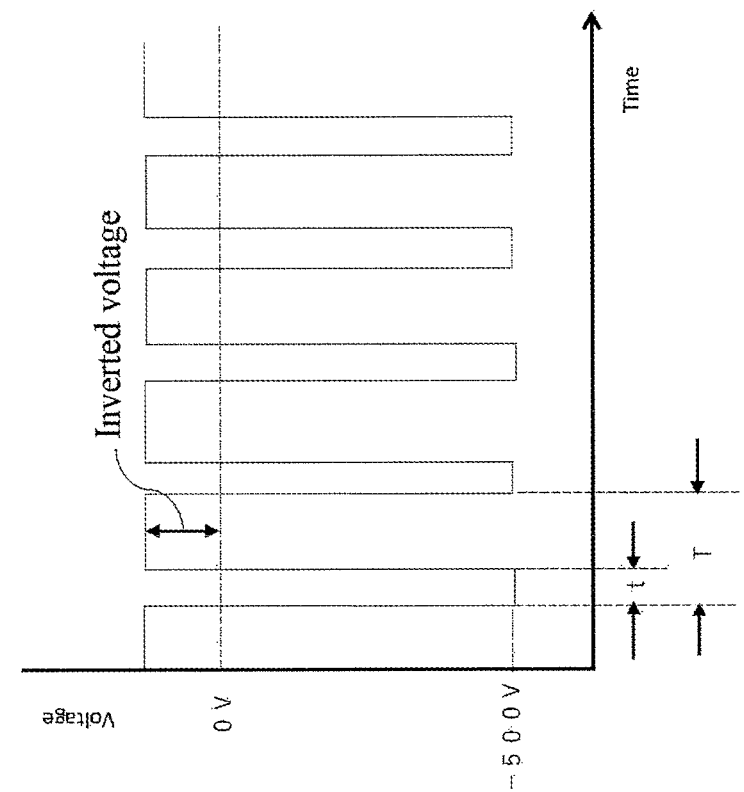
FIG. 2B is a voltage-time graph illustrating another example of the voltage pulse wave generated by the programmable transmitter 24, the first pulse-wave conversion switch 22, or the second pulse-wave conversion switch 23 of FIG. 1 when a bias DC power source 21 is provided.

As illustrated in FIG. 1, a bias DC power source 21 of a voltage of about +50 V (preferably +100 V or less) may be connected to a circuit of the first pulse-wave conversion switch 22 on the first sputtering electrode 18 side and a circuit of the second pulse-wave conversion switch 23 on the second sputtering electrode 19 side. FIG. 2B is a voltage-time graph illustrating another example of the voltage pulse wave generated by the programmable transmitter 24, the first pulse-wave conversion switch 22, or the second pulse-wave conversion switch 23 of FIG. 1 when the bias DC power source 21 is provided. By providing such a positive bias DC power source 21, as illustrated in the voltage-time graph of FIG. 2B, when the first pulse-wave conversion switch 22 and the second pulse-wave conversion switch 23 are OFF, an inverted voltage (+) is applied to the first sputtering electrode 18 and the second sputtering electrode 19. In the sputtering process, contents in the targets or impurities attached to the surfaces of the targets may be locally charged with + potential to generate an arc between the contents or impurities and the targets or sputtering electrodes to which − potential is applied. In this context, as illustrated in FIG. 2B, the inverted voltage pulse wave can be generated when the first pulse-wave conversion switch 22 and the second pulse-wave conversion switch 23 are OFF, thereby to actively remove (neutralize) the charge of + potential and suppress the occurrence of arc.

On the basis of the control signal from the film formation controller 26, the apparatus controller 25 controls the decompressor 13, the conductance valve 14, the discharge gas introducer 15, and the reactive gas introducer 16 and also controls the decompression of the film formation chamber 11 and the introduction timing of the discharge gas and reactive gas into the film formation chamber 11 in cooperation with the control of the pulsed reactive gas introducer 17 by the programmable transmitter 24. A specific example of use will be described later, but in an example, the discharge gas introducer 15 is controlled so that the inert gas such as argon gas is introduced from the discharge gas introducer 15 into the film formation chamber 11 during a period in which the electric power is supplied to the first sputtering electrode 18 and/or the second sputtering electrode 19, while the reactive gas introducer 16 is controlled so that the reactive gas such as oxygen or nitrogen is introduced from the pulsed reactive gas introducer 17 into the film formation chamber 11 during a period in which no electric power is supplied to the first sputtering electrode 18 and the second sputtering electrode 19.

Figure 7A:
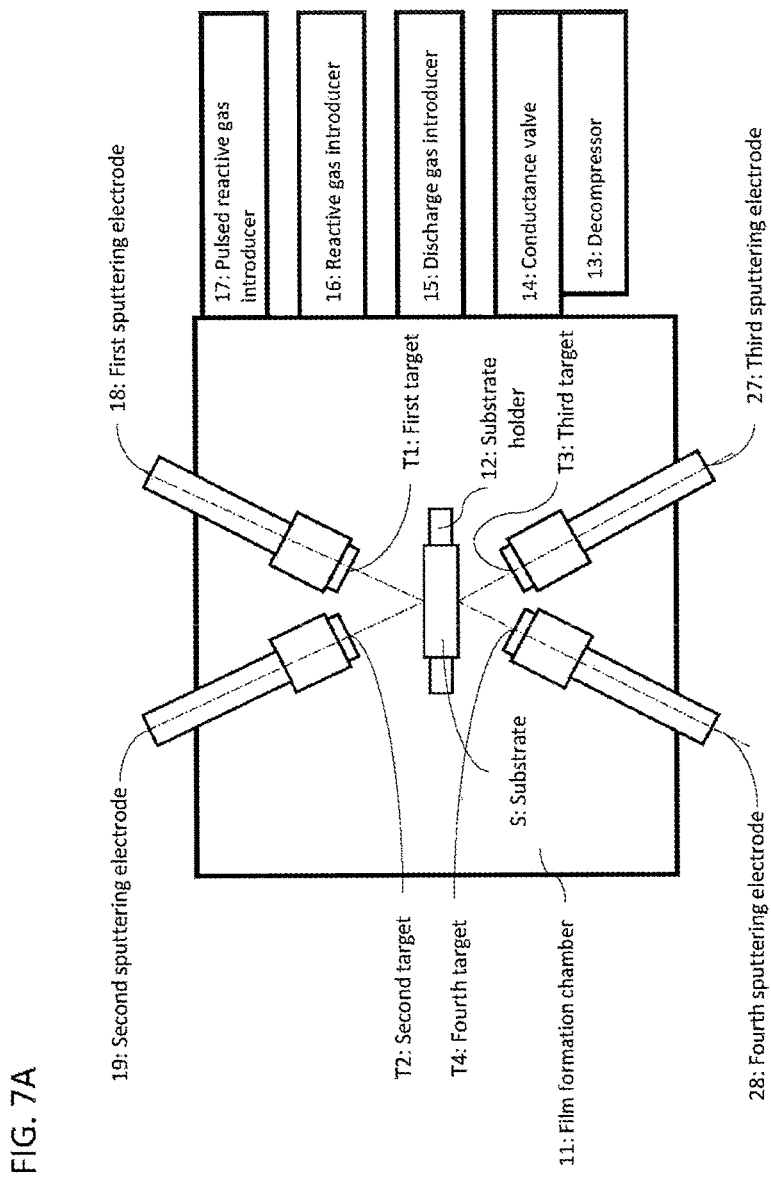
FIG. 7A is a block diagram illustrating the primary part of another embodiment of the reactive sputtering apparatus according to the present invention.
Figure 7B:
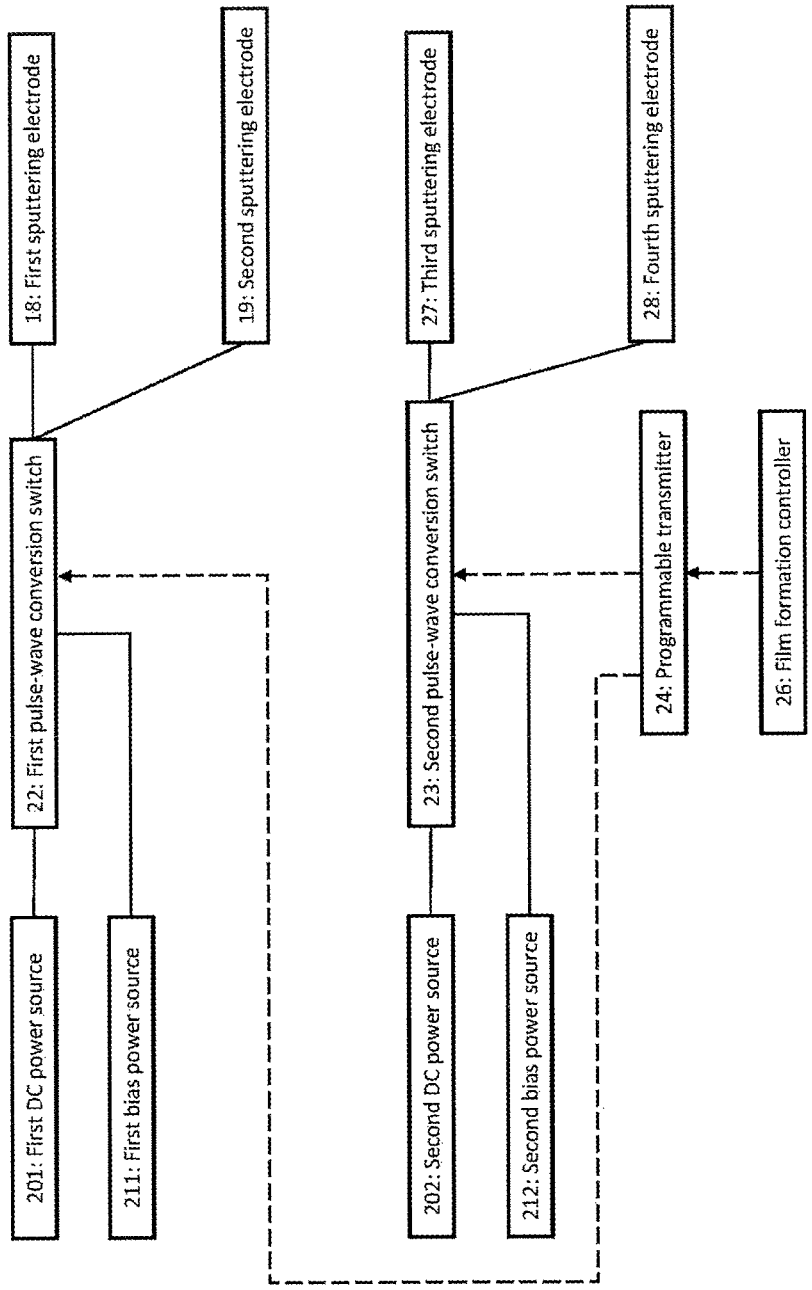
FIG. 7B is a block diagram illustrating an electric system of the reactive sputtering apparatus of FIG. 7A.

In the embodiment illustrated in FIG. 1, two sputtering electrodes 18 and 19 are provided only for one surface of the substrate S, but as illustrated in FIG. 7A and FIG. 7B, the substrate S may be held by the substrate holder 12 so that both surfaces of the substrate S to be formed with films are exposed, and a third sputtering electrode 27 and a fourth sputtering electrode 28 may be additionally provided below the substrate holder 12. The tip surface of the third sputtering electrode 27 holds a third target T3 while the tip surface of the fourth sputtering electrode 28 holds a fourth target T4. The third sputtering electrode 27 and the fourth sputtering electrode 28 are arranged such that the surface of the third target T3 and the surface of the fourth target T4 face the rear surface of the substrate S held by the substrate holder 12. In this case, although not particularly limited, as illustrated in FIG. 7B, the first pulse-wave conversion switch 22 is provided in the power supply lines between a first DC power source 201 and the first and second sputtering electrodes 18 and 19 while the second pulse-wave conversion switch 23 is provided in the power supply lines between a second DC power source 202 and the third and fourth sputtering electrodes 27 and 28. The programmable transmitter 24 may be configured to output the pulse generation control signal pattern, which corresponds to the value of electric power to be supplied to each of the first sputtering electrode 18 and the second sputtering electrode 19, to the first pulse-wave conversion switch 22, output the pulse generation control signal pattern, which corresponds to the value of electric power to be supplied to each of the third sputtering electrode 27 and the fourth sputtering electrode 28, to the second pulse-wave conversion switch 23, and perform the ON/OFF control.

In the above-described embodiments, the targets (the first target T1, second target T2, third target T3, and fourth target T4) provided for respective sputtering electrodes may be made of different materials for film formation, or one or more of them may be made of a different material or different materials for film formation, or all of them may be made of the same material for film formation.

Figure 3A:
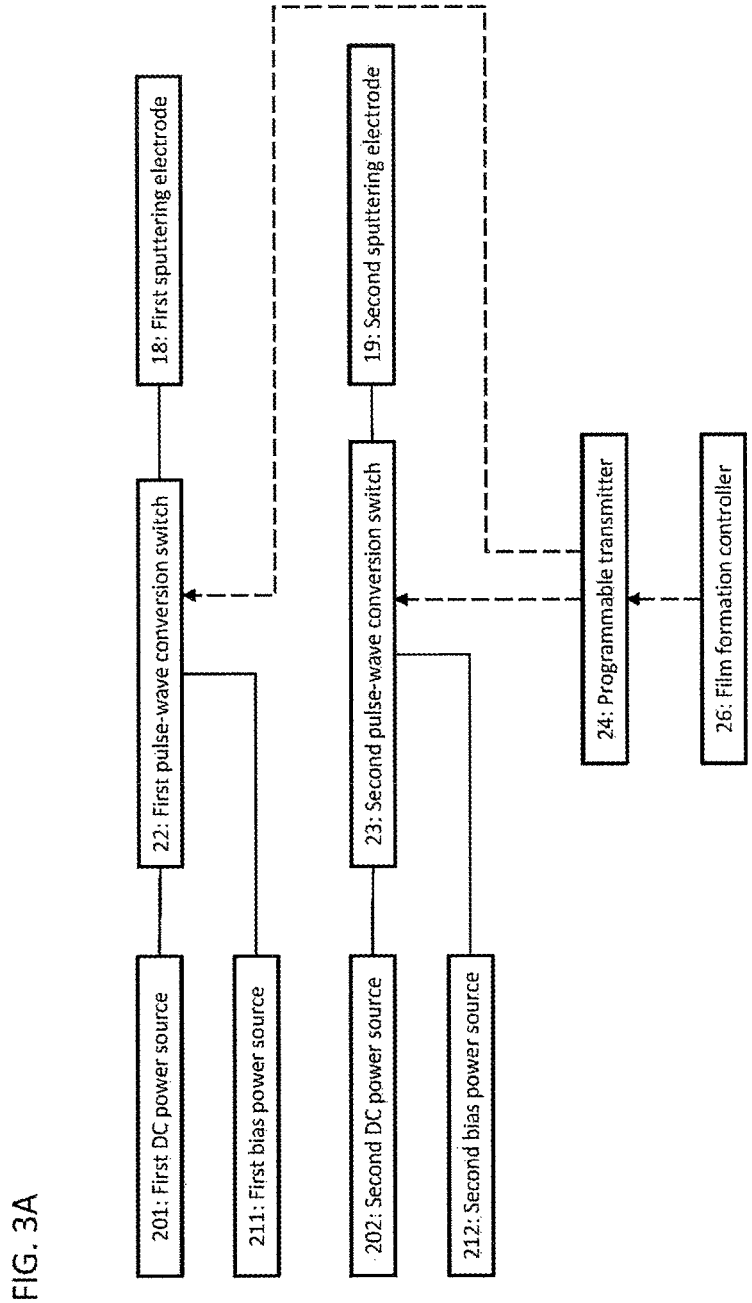
FIG. 3A is a block diagram illustrating the primary part of another embodiment of the reactive sputtering apparatus according to the present invention.
Figure 3B:
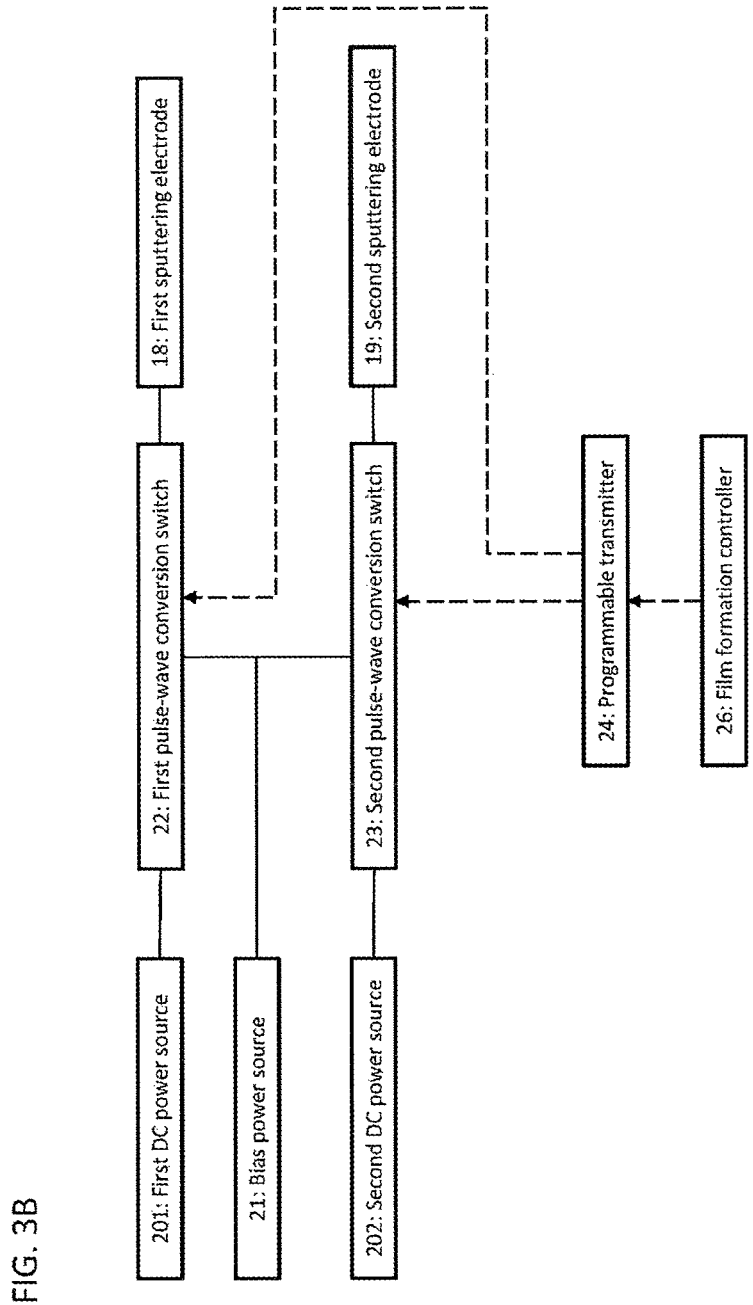
FIG. 3B is a block diagram illustrating the primary part of still another embodiment of the reactive sputtering apparatus according to the present invention.

The reactive sputtering apparatus 1 according to the present invention is not limited to providing a single DC power source 20 as illustrated in FIG. 1, and two or more DC power sources 20 may also be provided. FIG. 3A is a block diagram illustrating the primary part of another embodiment of the reactive sputtering apparatus according to the present invention while FIG. 3B is a block diagram illustrating the primary part of still another embodiment of the reactive sputtering apparatus according to the present invention. The embodiment illustrated in FIG. 3A is an example in which a first DC power source 201 and a second DC power source 202 are provided for two respective sputtering electrodes (the first sputtering electrode 18 and the second sputtering electrode 19) and a first bias DC power source 211 and a second bias DC power source 212 are provided for two respective pulse-wave conversion switches (the first pulse-wave conversion switch 22 and the second pulse-wave conversion switch 23). On the other hand, the embodiment illustrated in FIG. 3B is an example in which a first DC power source 201 and a second DC power source 202 are provided for two respective sputtering electrodes (the first sputtering electrode 18 and the second sputtering electrode 19) while a single bias DC power source 21 is provided for two pulse-wave conversion switches (the first pulse-wave conversion switch 22 and the second pulse-wave conversion switch 23).

《Film Formation Method Using Reactive Sputtering Apparatus》

Use of such a reactive sputtering apparatus 1 according to the present embodiments allows the sputtering process to form various types of films. FIG. 4A to FIG. 6D are time charts each illustrating an example of a film formation method using the reactive sputtering apparatus 1 according to the present invention, in which one period (one cycle) as a unit of the film formation steps is illustrated. Each of these figures illustrates a pulse generation control signal pattern programmed in the programmable transmitter 24 (the vertical axis in the figure represents ON/OFF and the horizontal axis represents time), in which the upper part illustrates the pulses applied to the first sputtering electrode 18, the middle part illustrates the pulses applied to the second sputtering electrode 19, and the lower part illustrates the pulse or pulses applied to the pulsed reactive gas introducer 17. All of the film formation methods are examples of forming a composite metal compound film or a mixed film of metal oxide films, metal nitride films, or the like by introducing a desired reactive gas from the reactive gas introducer 16 into the film formation chamber 11.

First Example

Figure 4A:
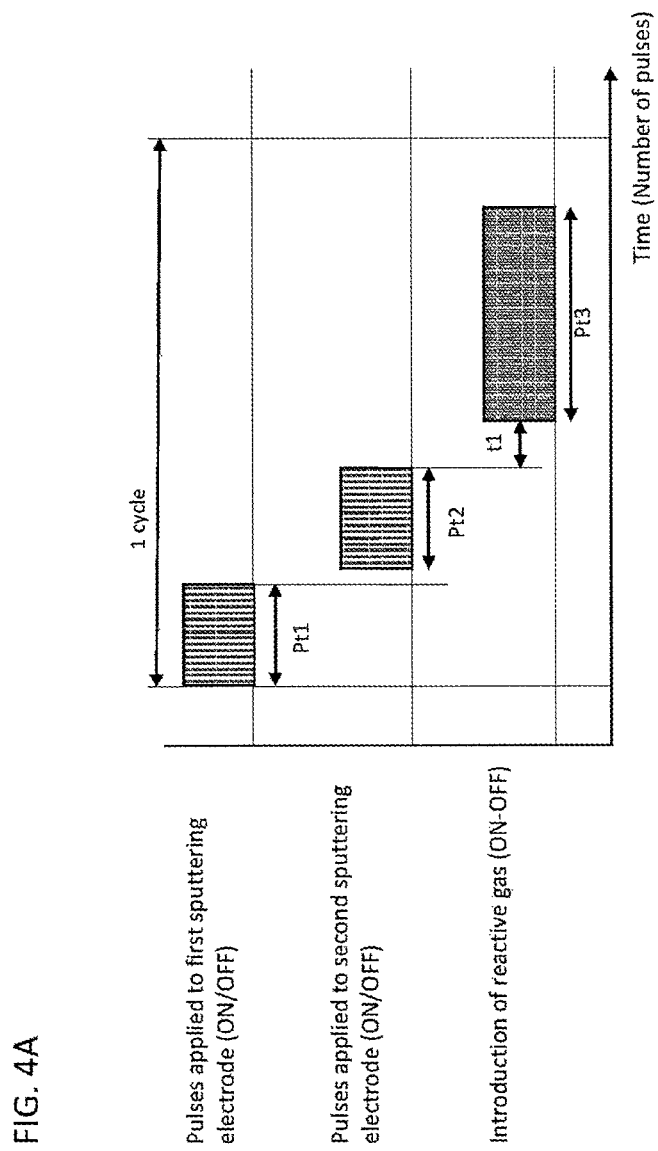
FIG. 4A is a time chart illustrating a first example of a film formation method using the reactive sputtering apparatus according to the present invention.

The film formation method illustrated in FIG. 4A includes applying pulses having a predetermined time width Pt1 to the first sputtering electrode 18 to form an ultrathin film from the first target T1, thereafter applying pulses having a predetermined time width Pt2 to the second sputtering electrode 19 to form an ultrathin film from the second target T2, and then introducing the reactive gas into the film formation chamber 11 after a time t1 thereby to react the ultrathin films formed on the substrate S for a predetermined time Pt3. This cycle is repeated until a targeted film thickness is obtained. In this case, the electric power supplied to the first sputtering electrode 18 and the electric power supplied to the second sputtering electrode 19 may be set to the same value or may also be set to different values.

Second Example

The film formation method illustrated in FIG. 4B includes applying pulses having a predetermined time width Pt2 to the second sputtering electrode 19 to form an ultrathin film from the second target T2, thereafter applying pulses having a predetermined time width Pt1 to the first sputtering electrode 18 to form an ultrathin film from the first target T1, and then introducing the reactive gas into the film formation chamber 11 after a time t1 thereby to react the ultrathin films formed on the substrate S for a predetermined time Pt3. This cycle is repeated until a targeted film thickness is obtained. This example represents a case in which the order of deposition from the first target T1 and deposition from the second target T2 is reversed from that in the above-described first example. In this case, the electric power supplied to the first sputtering electrode 18 and the electric power supplied to the second sputtering electrode 19 may be set to the same value or may also be set to different values.

Third Example

The film formation method illustrated in FIG. 4C includes applying pulses having a predetermined time width Pt1 to the first sputtering electrode 18 to form an ultrathin film from the first target T1, thereafter applying pulses having a predetermined time width Pt2 to the second sputtering electrode 19 to form an ultrathin film from the second target T2, and then introducing the reactive gas into the film formation chamber 11 after a time t2 (>t1) thereby to react the ultrathin films formed on the substrate S for a predetermined time Pt3. This cycle is repeated until a targeted film thickness is obtained. This example represents a case in which the time t2 from formation of the ultrathin film from the second target T2 to introduction of the reactive gas is prolonged as compared with the above-described first example. In this case, the electric power supplied to the first sputtering electrode 18 and the electric power supplied to the second sputtering electrode 19 may be set to the same value or may also be set to different values. In an alternative embodiment, the time from formation of the ultrathin film from the second target T2 to introduction of the reactive gas may be shortened as compared with the above-described first example.

Fourth Example

The film formation method illustrated in FIG. 4D includes applying pulses having a predetermined time width Pt2 to the second sputtering electrode 19 to form an ultrathin film from the second target T2 while applying pulses having a predetermined time width Pt1 to the first sputtering electrode 18 to form an ultrathin film from the first target T1, and then introducing the reactive gas into the film formation chamber 11 after a time t1 thereby to react the ultrathin films formed on the substrate S for a predetermined time Pt3. This cycle is repeated until a targeted film thickness is obtained. This example represents a case in which formation of the ultrathin film from the second target T2 is started before completion of formation of the ultrathin film from the first target T1 so that the ultrathin film from the second target T2 is partially superimposed with the ultrathin film from the first target T1, as compared with the above described first example. In this case, the electric power supplied to the first sputtering electrode 18 and the electric power supplied to the second sputtering electrode 19 may be set to the same value or may also be set to different values. The time t1 from formation of the ultrathin film from the second target T2 to introduction of the reactive gas may be appropriately set as in the first example and the third example.

Fifth Example

In the film formation method illustrated in FIG. 4E, at the same time as when pulses having a predetermined time width Pt1 are applied to the first sputtering electrode 18 to start formation of an ultrathin film from the first target T1, pulses having a predetermined time width Pt2 are applied to the second sputtering electrode 19 to start formation of an ultrathin film from the second target T2, and the formation of the ultrathin film from the second target T2 is completed before completion of the formation of the ultrathin film from the first target T1. Then, after a time t1, the reactive gas is introduced into the film formation chamber 11 thereby to react the ultrathin films formed on the substrate S for a predetermined time Pt3. This cycle is repeated until a targeted film thickness is obtained. This example represents a case in which the formation of the ultrathin film from the second target T2 is started and completed during the formation of the ultrathin film from the first target T1 so that the ultrathin film from the second target T2 is totally superimposed with the ultrathin film from the first target T1, as compared with the above described fourth example. In this case, the electric power supplied to the first sputtering electrode 18 and the electric power supplied to the second sputtering electrode 19 may be set to the same value or may also be set to different values. The time t1 from formation of the ultrathin film from the first target T1 to introduction of the reactive gas may be appropriately set as in the first example and the third example.

Sixth Example

Figure 4F:
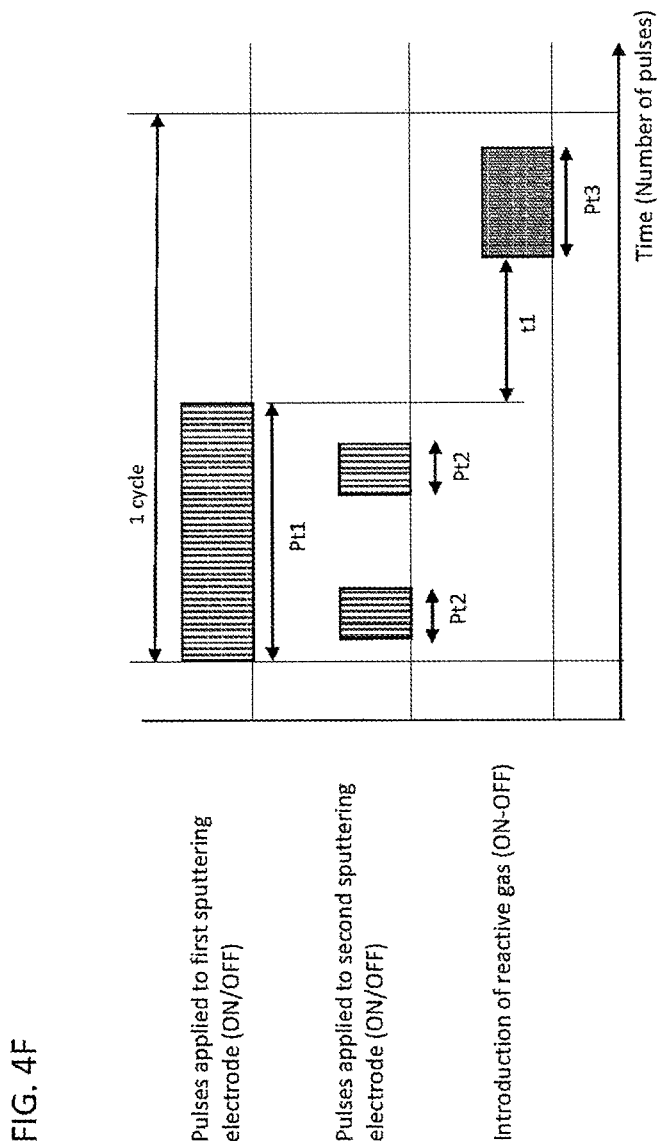
FIG. 4F is a time chart illustrating a sixth example of a film formation method using the reactive sputtering apparatus according to the present invention.

In the film formation method illustrated in FIG. 4F, while pulses having a predetermined time width Pt1 are applied to the first sputtering electrode 18 to form an ultrathin film from the first target T1, pulses having a predetermined time width Pt2 are applied to the second sputtering electrode 19 to start formation of an ultrathin film from the second target T2, and the formation of the ultrathin film from the second target T2 is completed before completion of the formation of the ultrathin film from the first target T1. In the example illustrated in the figure, application of the pulses having the predetermined time width Pt2 is carried out twice. Then, after a time t1, the reactive gas is introduced into the film formation chamber 11 thereby to react the ultrathin films formed on the substrate S for a predetermined time Pt3. This cycle is repeated until a targeted film thickness is obtained. This example represents a case in which the formation of the ultrathin films from the second target T2 is started and completed during the formation of the ultrathin film from the first target T1 so that the ultrathin films from the second target T2 are totally superimposed with the ultrathin film from the first target T1, as compared with the above described fourth example. In this case, the predetermined time width Pt2 for the first application to the second sputtering electrode 19 and that for the second application to the second sputtering electrode 19 may be set to the same value or may also be set to different values. The electric power supplied to the first sputtering electrode 18 and the electric power supplied to the second sputtering electrode 19 may be set to the same value or may also be set to different values. The time t1 from formation of the ultrathin film from the first target T1 to introduction of the reactive gas may be appropriately set as in the first example and the third example.

Seventh Example

Figure 5:
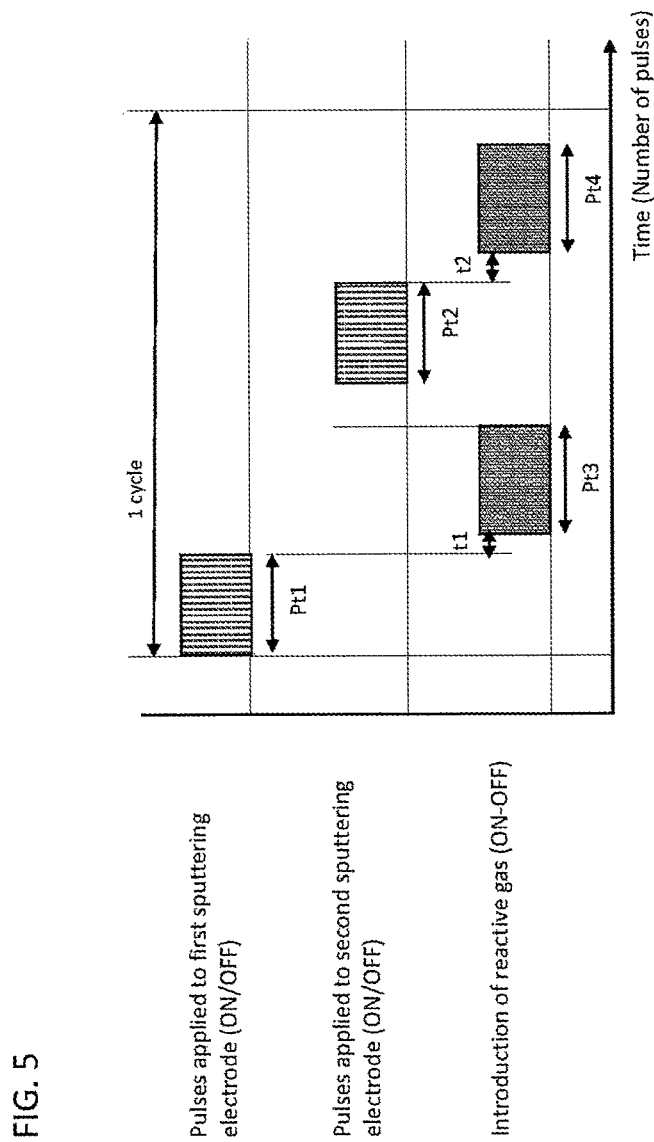
FIG. 5 is a time chart illustrating a seventh example of a film formation method using the reactive sputtering apparatus according to the present invention.

In the film formation method illustrated in FIG. 5, after pulses having a predetermined time width Pt1 are applied to the first sputtering electrode 18 to form an ultrathin film from the first target T1, the reactive gas is introduced into the film formation chamber 11 thereby to react the ultrathin film formed from the first target T1 on the substrate S for a predetermined time Pt3. Then, after pulses having a predetermined time width Pt2 are applied to the second sputtering electrode 19 to form an ultrathin film from the second target T2, the reactive gas is introduced into the film formation chamber 11 thereby to react the ultrathin film formed from the second target T2 on the substrate S for a predetermined time Pt4. This cycle is repeated until a targeted film thickness is obtained. In this case, the electric power supplied to the first sputtering electrode 18 and the electric power supplied to the second sputtering electrode 19 may be set to the same value or may also be set to different values. The time t1 from the formation of the ultrathin film from the first target T1 to the first introduction of the reactive gas, and the time t2 from the formation of the ultrathin film from the second target T2 to the second introduction of the reactive gas, may be appropriately set as in the first example and the third example. The predetermined time Pt3 for the first introduction of the reactive gas and the predetermined time Pt4 for the second introduction of the reactive gas may be set to the same value or may also be set to different values.

Eighth Example

Figure 6A:
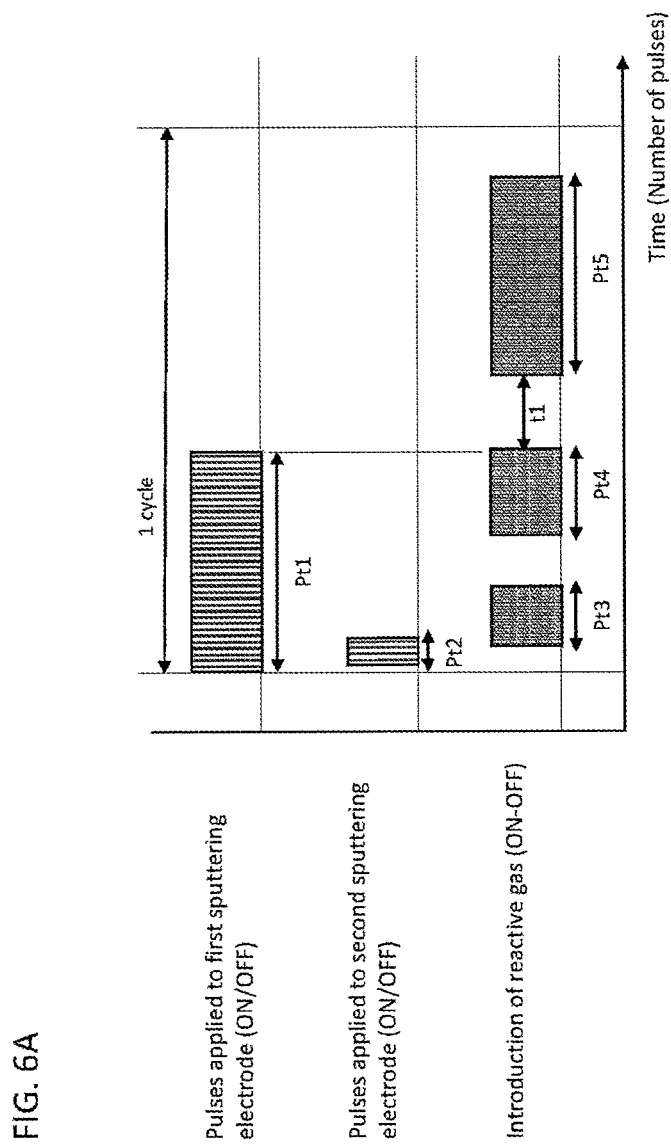
FIG. 6A is a time chart illustrating an eighth example of a film formation method using the reactive sputtering apparatus according to the present invention.

In the film formation method illustrated in FIG. 6A, approximately at the same time as when pulses having a predetermined time width Pt1 are applied to the first sputtering electrode 18 to start formation of an ultrathin film from the first target T1, pulses having a predetermined time width Pt2 are applied to the second sputtering electrode 19 to start formation of an ultrathin film from the second target T2, and the formation of the ultrathin film from the second target T2 is completed before completion of the formation of the ultrathin film from the first target T1. During this operation, the reactive gas is intermittently introduced into the film formation chamber 11 thereby to react the ultrathin films formed on the substrate S for predetermined times Pt3 and Pt4. Then, after a time t1, the reactive gas is introduced into the film formation chamber 11 thereby to react the ultrathin films formed on the substrate S for a predetermined time Pt5. This cycle is repeated until a targeted film thickness is obtained. This example represents a case in which the formation of the ultrathin film from the second target T2 is started and completed during the formation of the ultrathin film from the first target T1 so that while the ultrathin film from the second target T2 is totally superimposed with the ultrathin film from the first target T1, the first introduction and the second introduction of the reactive gas are performed to put the ultrathin film from the first target and the ultrathin film from the second target into a half-reaction state (transition mode), and the third introduction of the reactive gas is then performed for the complete reaction, as compared with the above described fifth example. In this case, the electric power supplied to the first sputtering electrode 18 and the electric power supplied to the second sputtering electrode 19 may be set to the same value or may also be set to different values. The time t1 from formation of the ultrathin film from the first target T1 to introduction of the reactive gas may be appropriately set as in the first example and the third example.

Ninth Example

Figure 6B:
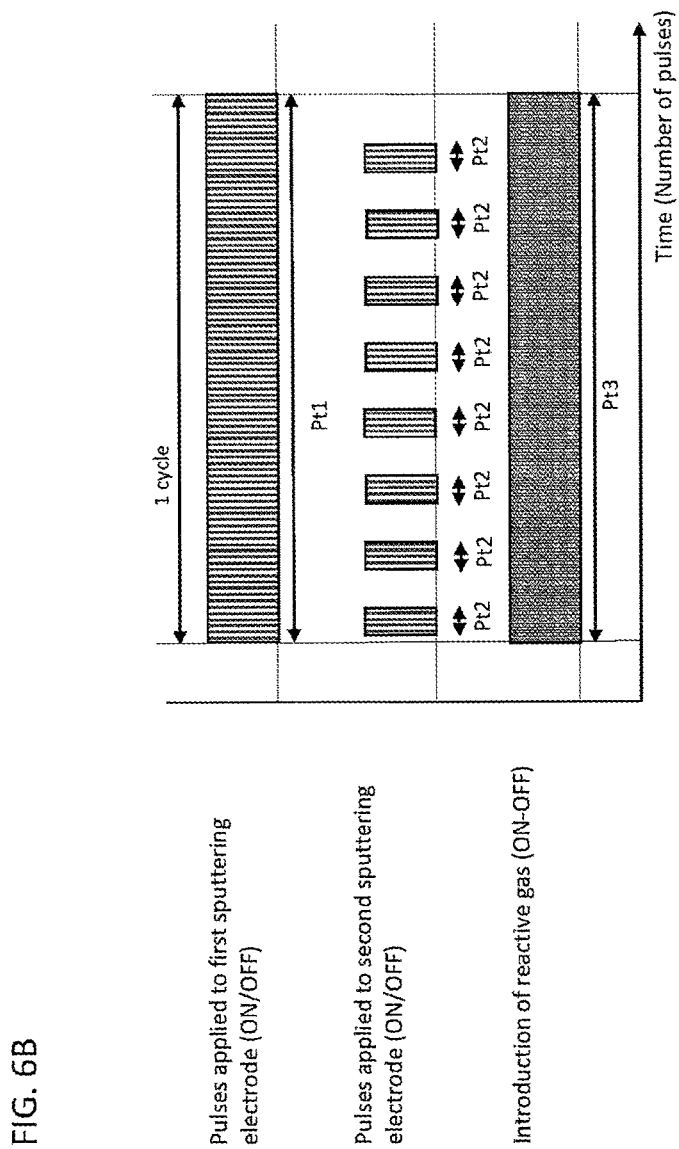
FIG. 6B is a time chart illustrating a ninth example of a film formation method using the reactive sputtering apparatus according to the present invention.

In the film formation method illustrated in FIG. 6B, pulses having a predetermined time width Pt1 are applied to the first sputtering electrode 18 to form an ultrathin film from the first target T1 full-time (Pt1) during one cycle of the film formation steps, and the reactive gas is introduced into the film formation chamber 11 thereby to react ultrathin films formed on the substrate S, likewise, full-time (Pt1) during one cycle of the film formation steps. During this operation, pulses having a predetermined time width Pt2 are applied to the second sputtering electrode 19 to form ultrathin films from the second target T2 twice or more times at regular intervals. This cycle is repeated until a targeted film thickness is obtained. This example represents a case in which the ultrathin films from the second target T2 are formed during the reaction of the ultrathin film from the first target T1 thereby to react the ultrathin film from the first target T1 and the ultrathin films from the second target T2, as compared with the above-described examples. In this case, the electric power supplied to the first sputtering electrode 18 and the electric power supplied to the second sputtering electrode 19 may be set to the same value or may also be set to different values.

Tenth Example

Figure 6C:
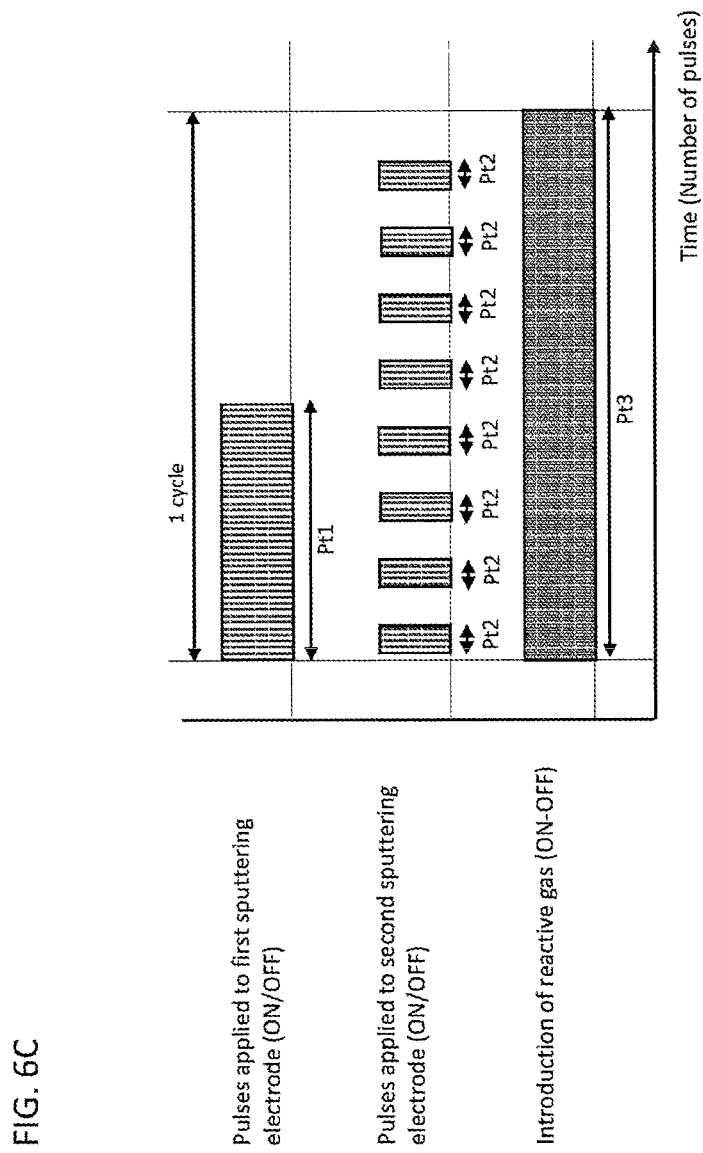
FIG. 6C is a time chart illustrating a tenth example of a film formation method using the reactive sputtering apparatus according to the present invention.

In the film formation method illustrated in FIG. 6C, pulses having a predetermined time width Pt1 are applied to the first sputtering electrode 18 to form an ultrathin film from the first target T1 in the first half (Pt1) of one cycle of the film formation steps, and the reactive gas is introduced into the film formation chamber 11 thereby to react ultrathin films formed on the substrate S full-time (Pt3) during one cycle of the film formation steps. During this operation, pulses having a predetermined time width Pt2 are applied to the second sputtering electrode 19 to form ultrathin films from the second target T2 twice or more times at regular intervals. This cycle is repeated until a targeted film thickness is obtained. This example represents a case in which the reaction of the ultrathin film from the first target T1 is limited to the first half of one cycle of the film formation steps thereby to increase the ratio of the ultrathin films from the second target T2 to the ultrathin film from the first target T1, as compared with the above-described ninth example. In this case, the electric power supplied to the first sputtering electrode 18 and the electric power supplied to the second sputtering electrode 19 may be set to the same value or may also be set to different values.

Eleventh Example

Figure 6D:
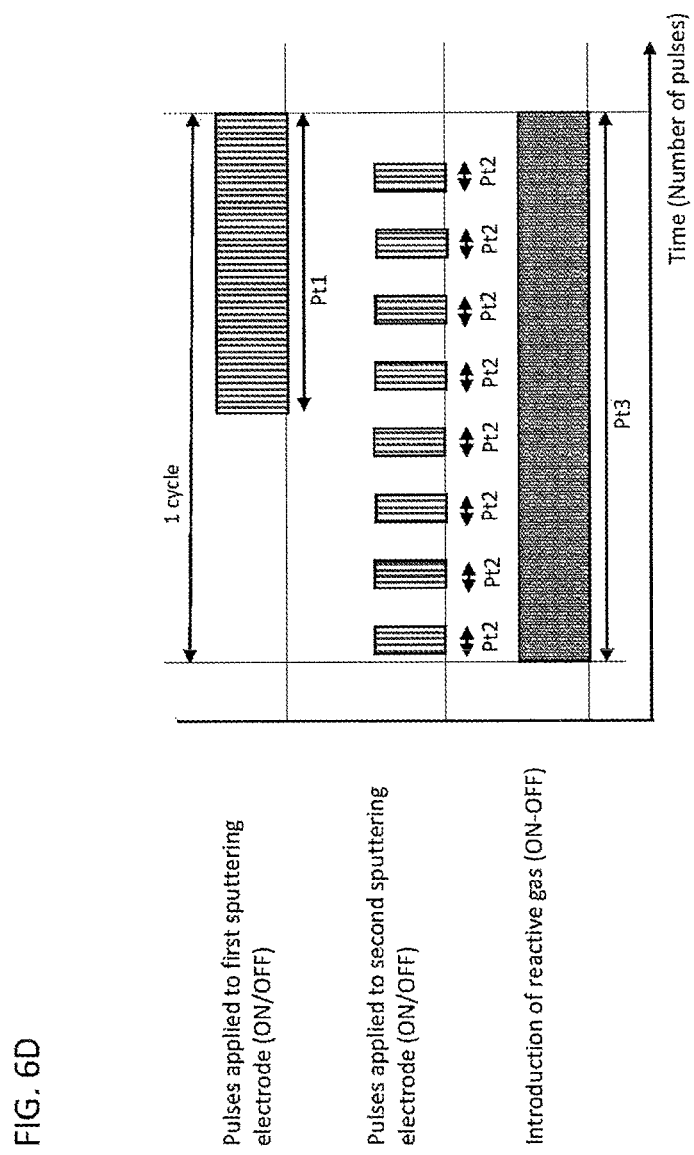
FIG. 6D is a time chart illustrating an eleventh example of a film formation method using the reactive sputtering apparatus according to the present invention.

In the film formation method illustrated in FIG. 6D, pulses having a predetermined time width Pt1 are applied to the first sputtering electrode 18 to form an ultrathin film from the first target T1 in the second half (Pt1) of one cycle of the film formation steps, and the reactive gas is introduced into the film formation chamber 11 thereby to react ultrathin films formed on the substrate S full-time (Pt3) during one cycle of the film formation steps. During this operation, pulses having a predetermined time width Pt2 are applied to the second sputtering electrode 19 to form ultrathin films from the second target T2 twice or more times at regular intervals. This cycle is repeated until a targeted film thickness is obtained. This example represents a case in which the reaction of the ultrathin film from the first target T1 is limited to the second half of one cycle of the film formation steps thereby to reduce the ratio of the ultrathin films from the second target T2 to the ultrathin film from the first target T1, as compared with the above-described ninth example. In this case, the electric power supplied to the first sputtering electrode 18 and the electric power supplied to the second sputtering electrode 19 may be set to the same value or may also be set to different values.

As described above, according to the reactive sputtering apparatus 1 of the present embodiment, the targets T1 and T2 of the two or more sputtering electrodes 18 and 19 are arranged to face the substrate S and the power supplied to each of the sputtering electrodes 18 and 19 is controlled by the control signal pattern to each of the pulse-wave conversion switches 22 and 23. The film formation from the two or more targets T1 and T2 can therefore be controlled independently. In this control, arbitrary independent control can be achieved by the program of the control signal pattern which is set with the programmable transmitter 24. Thus, simply by rearranging the program, it is possible to freely set the film thickness, composition, deposition order, etc. of a desired complex metal compound film.

That is, according to the reactive sputtering apparatus 1 of the present embodiment, the pulsed electric power from the DC power source 20 can be countermeasures against arcing on one hand, while on the other hand, provided that the "Hi" signal from the programmable transmitter 24 enables the electric power to be applied to the sputtering electrodes, the film formation rate can be controlled by adjusting the time of the "Hi" signal output from the programmable transmitter 24 per unit time. The programmable transmitter 24 can not only arbitrarily set the sputtering order, sputtering rate (deposition rate), and pause time, but also allow for the control of several microseconds order, which would require several tens of milliseconds when controlled by the conventional film formation apparatus with the cylindrical substrate holder being mechanically rotated. As a result, fine control such as deposition with atomic layer units can be realized.

Moreover, according to the reactive sputtering apparatus 1 of the present embodiment, the substrate S is held by the substrate holder 12 formed in a flat plate-like shape and, therefore, an unnecessary space is not formed in the film formation chamber 11 unlike the prior art. Thus, the size of the reactive sputtering apparatus 1 can be reduced and, at the same time, the rating of the decompressor 13 can be reduced. In addition, the amount of discharge gas and reactive gas used can also be reduced.

Further, according to the reactive sputtering apparatus 1 of the present embodiment, the incompletely-reacted metal sputtering and the reaction process can be repeated, and the reactive sputtering in a reactive gas atmosphere can be realized, as in the RAS-type reactive sputtering apparatus described in the Background Art section. In addition to this, a composite metal compound film and a mixed film can be formed using the programmable transmitter 24.

Furthermore, according to the reactive sputtering apparatus 1 of the present embodiment, it is possible not only to control the film formation rate but also to adjust the time of "Hi" signal from the programmable transmitter 24 in the film formation cycle thereby to control the film thickness of the ultrathin films. Adjustment of the time of "Hi" signal from the programmable transmitter 24 can be achieved by adjusting the duty ratio with the programmable transmitter 24, adjusting the pulse sputtering time in the film formation cycle with the programmable transmitter 24, or adjusting them in combination.

DESCRIPTION OF REFERENCE NUMERALS

1 Reactive sputtering apparatus
11 Film formation chamber
12 Substrate holder
13 Decompressor
14 Conductance valve
15 Discharge gas introducer
16 Reactive gas introducer
17 Pulsed reactive gas introducer
18 First sputtering electrode
19 Second sputtering electrode
20 DC power source
201 First DC power source
202 Second DC power source
21 Bias DC power source
211 First bias DC power source
212 Second bias DC power source
22 First pulse-wave conversion switch
23 Second pulse-wave conversion switch
24 Programmable transmitter
25 Apparatus controller
26 Film formation controller
27 Third sputtering electrode
28 Fourth sputtering electrode
T1 First target
T2 Second target
T3 Third target
T4 Fourth target
S Substrate

The invention claimed is:

1. A reactive sputtering apparatus comprising:
a film formation chamber;
a substrate holder provided in the film formation chamber, the substrate holder holding a substrate to be formed with a film;
a decompressor configured to reduce a pressure in the film formation chamber to a predetermined pressure;
a discharge gas introducer configured to introduce a discharge gas into the film formation chamber;
two sputtering electrodes each provided with a target to be a film-forming material, the sputtering electrodes facing the substrate as a single substrate;
a reactive gas introducer configured to introduce a reactive gas into the film formation chamber;
a DC power source configured to supply electric power to the two or more sputtering electrodes;
two pulse-wave conversion switches connected between the DC power source and the sputtering electrodes, the pulse-wave conversion switches each being configured to convert a DC voltage to be applied to each of the sputtering electrodes to a pulse-wave voltage, each pulse-wave conversion switch corresponding to each sputtering electrode one on one, such that each sputtering electrode is connected with a single pulse-wave conversion switch;
a programmable transmitter configured to be programmable with a pulse generation control signal pattern corresponding to the electric power to be supplied to each of the sputtering electrodes, the programmable transmitter being further configured to control independently each of the pulse-wave conversion switches in accordance with the programmed pulse generation control signal pattern; and a reactive gas introduction switch configured to control introduction of the reactive gas from the reactive gas introducer to the film formation chamber based directly on the pulse generation control signal pattern from the programmable transmitter.

2. The reactive sputtering apparatus according to claim 1, wherein the DC power source is provided as a single DC power source.

3. The reactive sputtering apparatus according to claim 1, further comprising one or more bias DC power sources on a sputtering electrode side of the pulse-wave conversion switches, the one or more bias DC power sources applying a bias voltage.

4. The reactive sputtering apparatus according to claim 1, wherein the substrate holder includes a heater configured to heat the substrate to a predetermined temperature.

5. The reactive sputtering apparatus according to claim 1, wherein the pulse-wave conversion switches are operated by a single generator configured to generate block pulses.

6. The reactive sputtering apparatus according to claim 1, wherein the sputtering electrodes are arranged such that a center axis of each of the sputtering electrodes sis directed toward a center of the substrate.

7. A film formation method for a composite metal compound film or a mixture film using the reactive sputtering apparatus according to claim 1 to subject the substrate to a film formation process, the film formation method comprising:

a first step of supplying, in a state in which the discharge gas is introduced in the film formation chamber, a first sputtering power programmed by the programmable transmitter to a sputtering electrode of the two sputtering electrodes to form a metal thin film from the target of the sputtering electrode on the substrate;

a second step of supplying, in the state in which the discharge gas is introduced in the film formation chamber, a second sputtering power programmed by the programmable transmitter to another sputtering electrode of the two sputtering electrodes to form a metal thin film from the target of the other sputtering electrode on the substrate; and a third step of introducing the reactive gas into the film formation chamber at least in one of a state in which the first sputtering power programmed by the programmable transmitter is supplied to any of the sputtering electrodes, a state in which the second sputtering power programmed by the programmable transmitter is supplied to any of the sputtering electrodes, and a state in which sputtering power programmed by the programmable transmitter is not supplied to the sputtering electrodes.

8. The film formation method for a composite metal compound film or a mixture film according to claim 7, wherein in one period of film formation steps, the second step is carried out after the first step is completed, and the third step is carried out after the second step is completed.

9. The film formation method for a composite metal compound film or a mixture film according to claim 7, wherein in one period of film formation steps, the second step is started after the first step is started and before the first step is completed, the second step is completed after the first step is completed, and the third step is carried out after the second step is completed.

10. The film formation method for a composite metal compound film or a mixture film according to claim 7, wherein in one period of film formation steps, the second step is carried out one or more times while the first step is carried out, and the third step is carried out after the first step is completed.

11. The film formation method for a composite metal compound film or a mixture film according to claim 7, wherein in one period of film formation steps, the third step is carried out after the first step is completed, the second step is carried out after the third step is completed, and the third step is carried out after the second step is completed.

12. The film formation method for a composite metal compound film or a mixture film according to claim 7, wherein in one period of film formation steps, the second step is carried out one or more times while the first step is carried out, the third step is carried out one or more times while the first step or the second step is carried out, and the third step is carried out after the first step and the second step are completed.

13. The film formation method for a composite metal compound film or a mixture film according to claim 7, wherein the third step is carried out full-time during one period of film formation steps, and while the third step is carried out, the first step is carried out full-time or part-time and the second step is carried out twice or more times.

14. The film formation method for a composite metal compound film or a mixture film according to claim 13, wherein the first step is carried out in a first half or a second half during which the third step is carried out.

15. The film formation method for a composite metal compound film or a mixture film according to claim 7, wherein the film formation process is carried out in a state in which the substrate is heated to a predetermined temperature.

* * * * *